(12) United States Patent
Zhong et al.

(10) Patent No.: US 10,497,226 B2
(45) Date of Patent: Dec. 3, 2019

(54) MEASUREMENT DEVICE AND METHOD

(71) Applicant: Fluke Corporation, Everett, WA (US)

(72) Inventors: Tao Zhong, Shanghai (CN); Xugang Chen, Shanghai (CN)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 15/256,400

(22) Filed: Sep. 2, 2016

(65) Prior Publication Data

US 2017/0069178 A1 Mar. 9, 2017

(30) Foreign Application Priority Data

Sep. 6, 2015 (CN) .......................... 2015 1 0559996

(51) Int. Cl.
| | | |
|---|---|---|
| *G08B 3/10* | (2006.01) |
| *G01R 15/26* | (2006.01) |
| *G01R 19/165* | (2006.01) |
| *G01R 19/25* | (2006.01) |
| *G01R 31/36* | (2019.01) |
| *G01R 15/12* | (2006.01) |
| *G01R 17/02* | (2006.01) |
| *G01R 15/18* | (2006.01) |

(52) U.S. Cl.
CPC .......... *G08B 3/1016* (2013.01); *G01R 15/26* (2013.01); *G01R 19/16561* (2013.01); *G01R 19/25* (2013.01); *G01R 15/12* (2013.01); *G01R 15/125* (2013.01); *G01R 15/186* (2013.01); *G01R 17/02* (2013.01); *G01R 19/16542* (2013.01); *G01R 31/3646* (2019.01)

(58) Field of Classification Search
CPC .... G08B 3/1016; G01R 15/12; G01R 15/125; G01R 15/186; G01R 15/26; G01R 19/16542; G01R 19/16561; G01R 19/25; H04L 12/2818; H04L 67/12; A61B 5/0002; A61B 2562/0204; A61B 2562/028; A63H 27/02; A63H 30/04
See application file for complete search history.

(56) References Cited

U.S. PATENT DOCUMENTS

| | | | |
|---|---|---|---|
| 6,189,384 B1 * | 2/2001 | Piety ...................... | G01H 1/003 73/592 |
| 6,581,036 B1 * | 6/2003 | Varney, Jr. .......... | G07C 9/00087 704/270 |
| 8,249,505 B1 | 8/2012 | Goldner et al. | |

(Continued)

FOREIGN PATENT DOCUMENTS

EP 2 693 222 A1 2/2014

OTHER PUBLICATIONS

Extended European Search Report, dated Feb. 2, 2017, for European Application No. 16187050.6-1568, 8 pages.

(Continued)

*Primary Examiner* — Orlando Bousono
(74) *Attorney, Agent, or Firm* — Seed Intellectual Property Law Group LLP

(57) ABSTRACT

A measurement device and method includes a controller for controlling performance of a test on a test object, a signal generator for generating a signal indicative of an audible prompt to audibly identify a test result of the test object, and a signal transmitter for wirelessly transmitting the signal indicative of the audible prompt to a device remote from the measurement device.

14 Claims, 2 Drawing Sheets

(56) References Cited

U.S. PATENT DOCUMENTS

| | | | |
|---|---|---|---|
| 2006/0258408 A1* | 11/2006 | Tuomela | H04B 13/005 455/569.1 |
| 2008/0154602 A1 | 6/2008 | Hollander et al. | |
| 2008/0275705 A1 | 11/2008 | Deveau et al. | |
| 2009/0204403 A1* | 8/2009 | Hollander | G01D 7/12 704/260 |
| 2009/0257602 A1* | 10/2009 | Darby | H04M 1/6091 381/86 |
| 2009/0262002 A1* | 10/2009 | Alexander | A63H 30/04 341/176 |
| 2010/0070273 A1 | 3/2010 | Rodriguez et al. | |
| 2010/0240307 A1* | 9/2010 | Sims | G08C 17/02 455/41.3 |
| 2010/0302031 A1* | 12/2010 | Komninos | H04L 12/2818 340/539.26 |
| 2011/0019830 A1* | 1/2011 | Leibman | H01Q 1/273 381/60 |
| 2011/0053518 A1* | 3/2011 | Shindo | H04B 17/0085 455/67.14 |
| 2013/0148701 A1* | 6/2013 | Vink | A61B 5/0002 375/219 |
| 2013/0321160 A1* | 12/2013 | Komninos | G08B 21/18 340/605 |
| 2014/0127729 A1* | 5/2014 | Moran | G01N 33/48771 435/14 |
| 2014/0128755 A1* | 5/2014 | Snyder | A61B 5/7405 600/502 |
| 2014/0225620 A1* | 8/2014 | Campbell | B60L 11/1838 324/426 |
| 2015/0295444 A1* | 10/2015 | Lottes | H01M 10/44 320/107 |
| 2015/0350586 A1* | 12/2015 | Kang | G06K 9/00288 348/734 |

OTHER PUBLICATIONS

Panasonic Industrial Devices Europe GmbH, "WI-FI IEEE 802.11 BGN + BT4.0 Radio Module," Specification for Production, Jul. 11, 2014, 53 pages.

\* cited by examiner

MEASUREMENT DEVICE AND METHOD

TECHNICAL FIELD

The present application relates to electronic measurement technology and, in particular, to a measurement device and method.

BACKGROUND

Each battery in a battery pack is an electrochemical device with a finite life. Individual batteries generally require inspection, maintenance, repair, and replacement in use of the battery pack. Typical measurements include temperature, voltage, current, internal resistance, impedance, conductance, battery condition and the date and time of the measurement. Temperature extremes, alternating ripple voltage, and current may reduce battery life. Batteries may be kept in rooms with controlled temperatures, but it is important to monitor the amount of AC ripple on a battery. As batteries age, their internal resistance increases and that also reduces their life. Other measured parameters include DC and AC voltage and current.

During a test, an operator typically holds a device, e.g. a multi-meter or a battery tester, for measuring and recording. The device has a pair of test leads that extend from a body of the device and terminate at a pair of probes respectively. Another operator manipulates the probes to contact with terminals of a battery under test. As the battery might be placed at a location which is difficult for measurement, extension arms can be attached to the probes to help the operator to reach the battery. Since the operators need to pay close attention to the position of probes, it is inconvenient to check a display of the device frequently. Therefore, there is a need to provide a measurement device which is convenient to prompt an operator of test results.

SUMMARY

An objective of the present application is to provide a measurement device which is convenient to prompt an operator of test results.

An aspect of the present application discloses a measurement device, comprising a controller for controlling performance of a test on a test object, a signal generator for generating a signal indicative of an audible prompt to audibly identify a test result of the test object, and a signal transmitter for wirelessly transmitting the signal indicative of the audible prompt to a device remote from the measurement device.

In the embodiment, as the signal indicative of the audible prompt is transmitted to and played by the remote device controlled by the operator, he or she can adjust the volume of the audible prompt to a proper level, by adjusting an output power of the remote device rather than that of the measurement device. The volume adjustment would not increase power consumption of the measurement device.

In some embodiments, the signal transmitter comprises a Bluetooth transmitter or a radio transmitter.

In some embodiments, the signal transmitter comprises a Bluetooth transmitter and a radio transmitter, and each of the Bluetooth transmitter and the radio transmitter can be selected to transmit the signal indicative of the audible prompt.

In some embodiments, the measurement device further comprises an input module for receiving a user input for selecting one or both of the Bluetooth transmitter and the radio transmitter to transmit the signal indicative of the audible prompt.

In some embodiments, the measurement device further comprises a data transmitter for wirelessly transmitting the test result of the test object, wherein the data transmitter is separate from the signal transmitter.

In some embodiments, the signal transmitter is further configured to wirelessly transmit the test result of the test object.

In some embodiments, the signal transmitter is mounted onto a body of the measurement device.

In some embodiments, the measurement device is a digital multi-meter, a battery tester, or a clamp meter.

Another aspect of the present application discloses a measurement method, comprising performing a test on a test object, generating a signal indicative of an audible prompt to audibly identify a test result of the test object, and wirelessly transmitting the signal indicative of the audible prompt to a device remote from the measurement device.

In some embodiments, the signal indicative of the audible prompt is transmitted via a Bluetooth transmitter and/or a radio transmitter.

In some embodiments, the measurement method includes wirelessly transmitting the test result of the test object, wherein the test result of the test object and the signal indicative of the audible prompt are transmitted via separate transmitters.

In some embodiments, the measurement method includes wirelessly transmitting the test result of the test object, wherein the test result of the test object and the signal indicative of the audible prompt are transmitted via the same transmitter.

In some embodiments, the measurement method includes receiving the signal indicative of the audible prompt and generating the audible prompt via the device remote from the measurement device.

In some embodiments, the device remote from the measurement device is a radio set, a speaker, a headset, an earphone, or a mobile terminal.

The foregoing has outlined, rather broadly, features of the present application. Additional features of the present application will be described, hereinafter. It should be appreciated by those skilled in the art that the conception and specific embodiments disclosed herein may be readily utilized as a basis for modifying or designing other structures or processes for carrying out the objectives of the present application. It should also be realized by those skilled in the art that such equivalent constructions do not depart from the spirit and scope of the present application as set forth in the appended claims.

BRIEF DESCRIPTION OF THE DRAWINGS

The aforementioned features and other features of the present application will be fully understood by reading the following description by referring to the accompanying drawings and the appended claims. It will be understood that, these accompanying drawings merely illustrate certain embodiments in accordance with the present application and should not be considered as limitation to the scope of the present application. Unless otherwise specified, the accompanying drawings need not be proportional, and similar reference characters generally denote similar elements.

DETAILED DESCRIPTION OF THE EMBODIMENTS

The following detailed description refers to the accompanying drawings which are a part of the present application. The illustrative embodiments described in the detailed description, the accompanying drawings, and the claims are not limiting, and other embodiments may be adopted, or modifications may be made without deviating from the spirit and subject of the present application. It should be understood that the various aspects of the present application described and graphically presented herein may be arranged, replaced, combined, divided and designed in many different configurations, and these different configurations are implicitly comprised in the present application.

Figure 1:
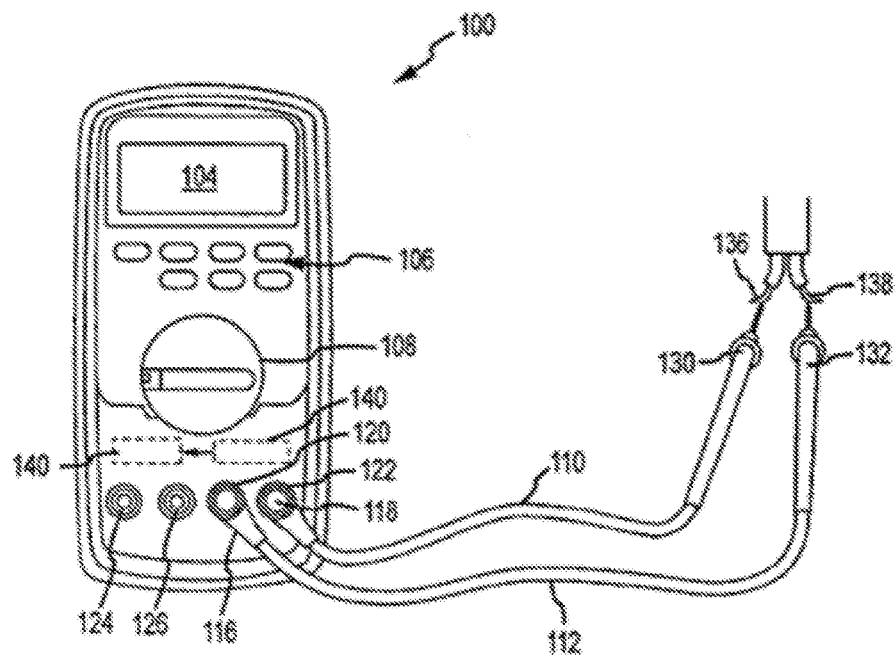
FIG. 1 is a planar view of a measurement device according to an embodiment of the present application.
Figure 2:
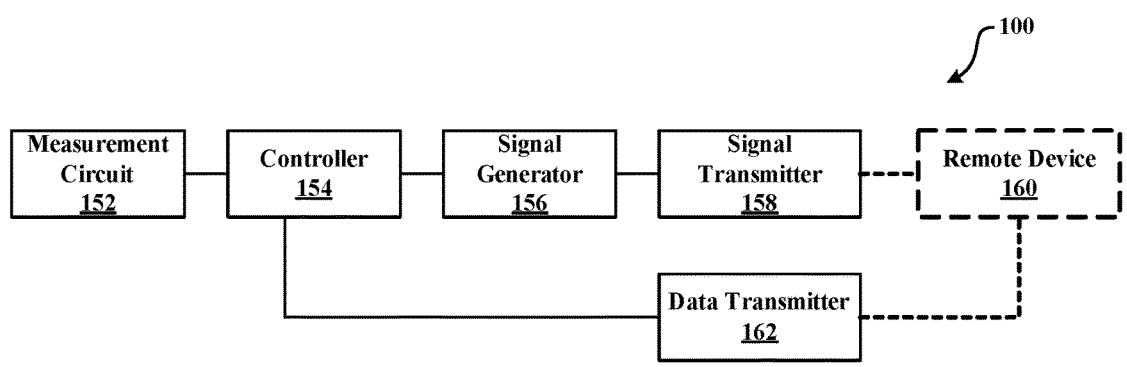
FIG. 2 is a block diagram of the measurement device in FIG. 1.

FIGS. 1 and 2 illustrate a measurement device 100 according to an embodiment of the present application. FIG. 1 is a planar view of the measurement device 100, and FIG. 2 is a block diagram of the measurement device 100. It should be noted that, in the embodiment of FIG. 1, the measurement device 100 is configured as a portable battery tester. In other embodiments of the present application, the measurement device 100 can be configured as a desktop battery tester, a portable multi-meter, a desktop multi-meter, a digital multi-meter, a clamp meter, or any other suitable measurement devices.

As shown in FIG. 1, the measurement device 100 includes a display 104, manually operable buttons 106, and a rotatable mode selector switch 108. In some embodiments, other types of user input interfaces, e.g. a touch screen or a touch panel, can be used, except for the buttons 106 and the selector switch 108. A pair of test leads 110 and 112 have plugs 116 and 118, respectively. The plugs 116 and 118 can be plugged into respective jacks 120 and 122 of the measurement device 100, thereby connected to two electrical leads (not shown in FIG. 1) of an internal circuit 140 inside the measurement device 100. Either of jacks 124 and 126 can be plugged with one of the plugs 116 and 118, thereby measuring resistance or other electrical parameters, such as current or voltage, under the selection of the selector switch 108. The test leads 110 and 112 further include a first test probe 130 and a second test probe 132, respectively. The test probes 130 and 132 are connected to two test points 136 and 138 of a test object, e.g. a positive electrode and a negative electrode of a battery under test, such that the test object can be connected to the internal circuit 140 through the test leads 110 and 112. The internal circuit 140 of the measurement device 100 can perform the measurement based on an electrical signal delivered through the test leads 110 and 112, and generate a test result. In some embodiments, the test result can be in a digital format, which can be displayed on the display 104 for prompting an operator operating the measurement device 100.

FIG. 2 illustrates a block diagram of the measurement device 100. As shown in FIG. 2, the measurement device 100 includes a measurement circuit 152 that can be selectively coupled to the test points 136 and 138 (e.g. through the jacks 120 and 122 or 124 and 126 and the test leads) for measuring the electrical signal collected from the test object. The measurement device 100 further includes a controller 154 for controlling performance of a test on a test object. For example, the controller 154 can be coupled to the measurement circuit 152 so as to provide a control signal to the measurement circuit 152 for starting, stopping, continuing, or terminating the measurement. The controller 154 can also receive the test result output from the measurement circuit 152, and the test result can be converted into a digital format by an analog-digital converter, for example. In some embodiments, the controller 154 may further control storing the test result in a memory of the measurement device 100. The test result can be displayed on the display 104 for an operator.

The measurement device 100 further includes a signal generator 156 which receives the test result. For example, the signal generator 156 can be coupled to the controller 154 to receive the test result from the controller 154 such that a signal indicative of an audible prompt can be generated to audibly identify the test result of the test object based on the test result. In some embodiments, the signal indicative of the audible prompt can be an audible signal that is suitable for conversion into an audible sound by a speaker, a headset, or an earphone, etc. In some embodiments, the signal generator 156 can be a voice generation module that can convert data corresponding to numbers, words, or alphanumeric characters into a voice prompt having phonemes corresponding to the data. Such modules can employ text-to-speech technology and include hardware, software, or combinations thereof. For example, when the test result is "0.5 ohm", the signal generator 156 can convert the reading of "0.5 ohm" into a voice signal of "0.5" and "ohm" based on a preset text-to-speech conversion rule or database.

In some embodiments, except for the measurement reading, the test result may further include other information relevant to the measurement, such as alert information. For example, the controller 154 can compare the reading of the test result with a preset reference range indicative of a normal range of the electrical parameter being tested. If the reading exceeds the reference range, corresponding alert information can be generated to prompt the operator. Other information relevant to the measurement may also include information indicating position or sequence of the measurement, e.g. indicating the sequence number of the test object being tested, or indicating an $n^{th}$ measurement of the test object of a set of measurements. Similarly, the alert information or other information relevant to the measurement can be converted into the signal indicative of the audible prompt by the signal generator 156.

The measurement device 100 further includes a signal transmitter 158 that may be a Bluetooth transmitter, a radio transmitter, or any other communication module having similar functions. The signal transmitter 158 is coupled to the signal generator 156, and receives and modulates the signal indicative of the audible prompt. The signal transmitter 158 then wirelessly transmits the signal to a remote device 160 separate from the measurement device 100 via wireless communication. In some embodiments, the signal transmitter 158 can be mounted onto a body of the measurement device. The remote device 160 being separate from the measurement device 100 refers to that the two are not constructed within a single physical component. The remote device 160 and the measurement device 100 can be powered by different power supplies, or powered by a single power supply. In some embodiments, the remote device 160 can be an electroacoustic conversion device, e.g. a speaker, a headset, an earphone, or a radio set, having a wireless receiving function, or a wireless receiving device such as a mobile terminal, a wireless measurement probe, or a measurement handle integrated with such an electroacoustic conversion device. The remote device 160 can demodulate the signal transmitted from the measurement device 100 so as to recover the signal indicative of the audible prompt. The remote device 160 can further convert the signal into an audible prompt.

From the foregoing, the measurement device 100 transmits the signal indicative of the audible prompt to the remote device 160, and thus no additional power is required for the measurement device 100 itself to generate the audible prompt. Therefore, power consumption of the measurement device 100 can be significantly reduced. In addition, as the remote device is placed near the operator, the operator can put the device at any proper position such that he or she can hear the audible prompt clearly even if the surrounding environment is noisy. In some embodiments, the operator may wear in his or her ears an earphone or a headset as the remote device, which is helpful to block the ambient noises in some extent. Additionally, the earphone or the headset has relatively less power consumption. Therefore, it may be more convenient for an operator to perform the measurement if an earphone or a handset is used to play the audible prompt. In some other embodiments, the remote device can be a device having an individual power supply (especially a non-portable power supply, such as an AC power supply), e.g. a desktop radio, a speaker, or a loudspeaker box etc. Thus, the operator can increase the sound volume without worrying about the power consumption issue.

In some embodiments, the signal transmitter 158 may be a single-type transmitter such as a Bluetooth transmitter or a radio transmitter. The transmitted signal indicative of the audible prompt can only be received by one or more remote devices paired with the transmitter and of the same type. In some other embodiments, the signal transmitter 158 may include various types of communication modules, e.g. having a Bluetooth transmitter and a radio transmitter. In this way, the signal transmitted by the signal transmitter 158 can be received by various types of remote devices. For example, the Bluetooth transmitter can transmit the signal to a remote device having a Bluetooth receiver, and the radio transmitter can transmit the signal to another remote device having a radio receiver. Alternatively, the various types of communication modules included in the signal transmitter 158 can transmit the signal according to the selection by the operator. For example, an input module (e.g. buttons) of the measurement device 100 can receive a user input from the operator, which is used for selecting at least one of the Bluetooth transmitter and the radio transmitter to transmit the signal. According to the user input, the measurement device 100 can control the selected transmitter of the signal transmitter 158 to transmit the signal.

In practice, the operator can make a selection from various types of transmitters based on what remote device he or she is taking. For example, if the operator is taking a remote device having only a radio receiver, the radio transmitter can be selected to transmit the signal indicative of the audible prompt. If the operator is taking a remote device having only a Bluetooth receiver, the Bluetooth transmitter can be selected to transmit the signal indicative of the audible prompt. If a plurality of operators are taking their respective remote devices having either a Bluetooth receiver or a radio receiver, both of the radio transmitter and the Bluetooth transmitter can be selected to transmit the signal simultaneously.

In some embodiments, the Bluetooth transmitter, which is used as the signal transmitter, can adopt a Bluetooth protocol of a version requiring low power consumption, such as Bluetooth version 4.0. The Bluetooth transmitter with that version has low power consumption, and is capable of transmitting the signal intermittently. In addition, the Bluetooth protocol can support one-to-one connection, or one-to-multiple connection such that the signal can be transmitted to a plurality of remote devices.

As shown in FIG. 2, in some embodiments, the measurement device 100 may further include a data transmitter for wirelessly transmitting the test result of the test object to the remote device 160 which receives the signal indicative of the audible prompt, or any other devices which are separate from but communicatively coupled to the measurement device 100. In some embodiments, the remote device 160 is a device having a data processing function, such as a mobile terminal. Correspondingly, the remote device 160 receives and processes the test result, such as storing the test result in a memory or displaying the test result on a display. In some embodiments, the remote device 160 is a wireless measurement handle or probe attached with an earphone or a headset and paired with the measurement device 100. Optionally, the wireless measurement handle or probe may include a display for displaying the test result.

In some embodiments, the data transmitter 162 is separate from the signal transmitter 158. In other words, the signal transmitter 158 is used for transmitting the signal indicative of the audible prompt, while the data transmitter 162 is used for transmitting data of the test result. In this way, these two kinds of signals would not interfere with each other during transmission. In addition, the signal transmitter 158 and the data transmitter 162 can use different types of communication modules to satisfy different practical requirements. Generally, the data transmission of the test result (typically transmitted continuously) is different from the transmission of the signal indicative of the audible prompt (typically transmitted intermittently). For example, the signal transmitter 158 may be or include a radio transmitter, while the data transmitter 162 may be or include a Bluetooth transmitter, a ZigBee transmitter, or other types of transmitters. In some examples, the signal transmitter 158 may be a Bluetooth transmitter of version 4.0, while the data transmitter 162 may be a Bluetooth transmitter of version 2.0.

In some embodiments, the data transmitter 162 may be integrated with the signal transmitter 158 to form a single component. Correspondingly, with the transmitter, the signal indicative of the audible prompt and the test result can be transmitted to a single remote device or to different remote devices. In some embodiments, a Bluetooth transmitter can be used for transmitting both the signal indicative of the audible prompt and the test result, and the Bluetooth transmitter can be communicatively coupled to a plurality of Bluetooth receivers, such as to a Bluetooth receiver of a Bluetooth headset and to a Bluetooth connection port of a mobile terminal. Correspondingly, the Bluetooth headset can receive the signal indicative of the audible prompt and generate the audible prompt, and the mobile terminal can receive and display the test result.

It should be noted that, although in the above embodiments the signal transmitter 158 and the data transmitter 162 are described as transmitting data or signals in a one-way direction, i.e. from the measurement device 100 to the remote device 160, the communication between the measurement device 100 and the remote device 160 can be bidirectional. In some embodiments, the signal transmitter 158 and/or the data transmitter 162 can be integrated within a communication module with both signal/data transmission and receiving functions, so as to achieve a bidirectional communication between the measurement device and the remote device 160.

Figure 3:
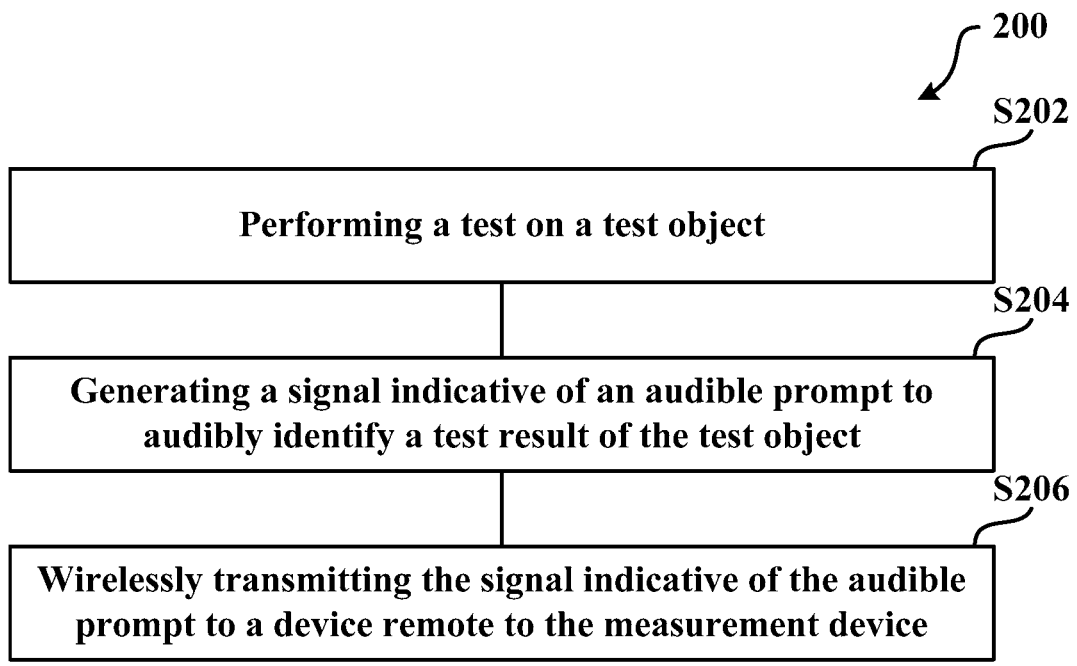
FIG. 3 is a flow chart illustrating a measurement method according to an embodiment of the present application.

FIG. 3 illustrates a measurement method 200 according to an embodiment of the present application. The measurement method 200 can be a combination of automatic and/or manual steps undertaken by the measurement device 100 in FIGS. 1 and 2 based upon hardware, software, or combinations thereof, and inputs from an operator operating the measurement device 100.

As shown in FIG. 3, the measurement method 200 includes the following steps.

In step S202, a test is performed on a test object. In step S204, a signal indicative of an audible prompt is generated to audibly identify a test result of the test object, and the test result can be emitted in form of an audible sound or voice. In step S206, the signal indicative of the audible prompt is wirelessly transmitted to a remote device separate from the measurement device.

In some embodiments, the signal indicative of the audible prompt is transmitted via a Bluetooth transmitter and/or a radio transmitter.

In some embodiments, the measurement method 200 further comprises wirelessly transmitting the test result of the test object, wherein the test result of the test object and the signal indicative of the audible prompt are transmitted via separate transmitters.

In some embodiments, the measurement method 200 further comprises wirelessly transmitting the test result of the test object, wherein the test result of the test object and the signal indicative of the audible prompt are transmitted via the same transmitter.

In some embodiments, the measurement method 200 further comprises receiving the signal indicative of the audible prompt and generating the audible prompt via the device remote from the measurement device.

In some embodiments, the remote device is a radio set, a speaker, a headset, an earphone, or a mobile terminal.

It should be noted that, although several modules or sub-modules of certain portable measurement devices are described in the detailed description above, such classification is merely exemplary rather than mandatory. In fact, according to the embodiments of the present application, features or functions of two or more modules described above can be embodied in a single module. On the contrary, features or functions of a module described above can be further embodied in several separate modules.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. Any reference signs in the claims should not be construed as limiting the scope.

The invention claimed is:

1. A measurement device, comprising:
a controller for controlling performance of a test on a test object;
a signal generator for generating an electrical signal indicative of an audible prompt to audibly identify a test result of the test on the test object;
a signal transmitter for wirelessly transmitting the electrical signal indicative of the audible prompt to a device remote from the measurement device; and
an input module for receiving user input,
wherein:
the signal transmitter comprises both a Bluetooth transmitter and a separate non-Bluetooth radio transmitter,
the Bluetooth transmitter and the separate non-Bluetooth radio transmitter are each selectable to transmit the electrical signal indicative of the audible prompt,
the user input includes a selection of one or both of the Bluetooth transmitter and the separate non-Bluetooth radio transmitter to transmit the electrical signal indicative of the audible prompt, and
when both the Bluetooth transmitter and the non-Bluetooth radio transmitter are selected to transmit the electrical signal, the electrical signal is simultaneously transmitted from the measurement device by both the Bluetooth transmitter and the non-Bluetooth radio transmitter.

2. The measurement device of claim 1, further comprising:
a data transmitter for wirelessly transmitting the test result of the test object, wherein the data transmitter is separate from the signal transmitter.

3. The measurement device of claim 1, wherein the signal transmitter is further configured to wirelessly transmit the test result of the test object.

4. The measurement device of claim 1, wherein the signal transmitter is mounted onto a body of the measurement device.

5. The measurement device of claim 1, wherein the measurement device is a digital multi-meter, a battery tester, or a clamp meter.

6. The measurement device of claim 2, wherein the wireless transmission of the test result is different from the wireless transmission of the electrical signal indicative of the audible prompt.

7. The measurement device of claim 6, wherein the electrical signal indicative of the audible prompt and the wireless transmission of the test result are transmitted to different remote devices.

8. A measurement method, comprising:
performing, by a measurement device, a test on a test object;
generating an electrical signal indicative of an audible prompt to audibly identify a test result of the test on the test object;
receiving, by an input module of the measurement device, user input regarding transmission of the electrical signal; and
wirelessly transmitting the electrical signal indicative of the audible prompt to a device remote from the measurement device according to the received user input,
wherein:
the measurement device includes a Bluetooth transmitter and a separate non-Bluetooth radio transmitter that are each selectable to transmit the electrical signal indicative of the audible prompt,
the user input includes a selection of one or both of the Bluetooth transmitter and the separate non-Bluetooth radio transmitter to transmit the electrical signal indicative of the audible prompt, and
when both the Bluetooth transmitter and the non-Bluetooth radio transmitter are selected to transmit the electrical signal, the electrical signal is simultaneously transmitted from the measurement device by both the Bluetooth transmitter and the non-Bluetooth radio transmitter.

9. The measurement method of claim 8, further comprising:
wirelessly transmitting the test result of the test object, wherein the test result of the test object and the electrical signal indicative of the audible prompt are transmitted via separate transmitters.

10. The measurement method of claim 8, further comprising:
wirelessly transmitting the test result of the test object, wherein the test result of the test object and the electrical signal indicative of the audible prompt are transmitted via the same transmitter.

11. The measurement method of claim 8, further comprising:
receiving the electrical signal indicative of the audible prompt and generating the audible prompt via the device remote from the measurement device.

12. The measurement method of claim 8, wherein the device remote from the measurement device is a radio set, a speaker, a headset, an earphone, or a mobile terminal.

13. The measurement method of claim 8, further comprising receiving a user input for selecting both of the Bluetooth transmitter and the separate non-Bluetooth radio transmitter to simultaneously transmit the electrical signal indicative of the audible prompt from the measurement device.

14. The measurement method of claim 8, wherein the remote device is a wireless measurement handle or probe that has a display, the method further comprising receiving and displaying the test result on the display of the remote device.

\* \* \* \* \*